(12) United States Patent
Hong et al.

(10) Patent No.: US 12,237,837 B2
(45) Date of Patent: Feb. 25, 2025

(54) SIGNAL GENERATION APPARATUS CAPABLE OF REJECTING NOISE

(71) Applicant: SK hynix Inc., Icheon-si (KR)

(72) Inventors: Jaehyeong Hong, Icheon-si (KR); Junseo Jang, Icheon-si (KR); In Seok Kong, Icheon-si (KR); Soon Sung An, Icheon-si (KR); Dae Ho Yang, Icheon-si (KR); Kwan Su Shon, Icheon-si (KR); Yo Han Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 121 days.

(21) Appl. No.: 18/085,333

(22) Filed: Dec. 20, 2022

(65) Prior Publication Data

US 2023/0208410 A1 Jun. 29, 2023

(30) Foreign Application Priority Data

Dec. 27, 2021 (KR) .................. 10-2021-0188509

(51) Int. Cl.
*H03K 5/1252* (2006.01)
*G06F 1/06* (2006.01)
*H03K 19/21* (2006.01)

(52) U.S. Cl.
CPC ............ *H03K 5/1252* (2013.01); *G06F 1/06* (2013.01); *H03K 19/21* (2013.01)

(58) Field of Classification Search
CPC ......... H03K 5/1252; H03K 19/21; G06F 1/06
See application file for complete search history.

(56) References Cited

U.S. PATENT DOCUMENTS

| | | | | |
|---|---|---|---|---|
| 5,113,098 A | * | 5/1992 | Teymouri | H03K 3/3565 327/552 |
| 7,433,426 B2 | * | 10/2008 | Zhu | H03K 5/1252 327/563 |
| 2015/0188523 A1 | * | 7/2015 | Iguelmamene | H03K 3/012 327/206 |
| 2022/0416790 A1 | | 12/2022 | Hwang et al. | |

FOREIGN PATENT DOCUMENTS

KR 1020160099861 A 8/2016
KR 101903841 B1 10/2018

* cited by examiner

*Primary Examiner* — Lincoln D Donovan
*Assistant Examiner* — James G Yeaman
(74) *Attorney, Agent, or Firm* — WILLIAM PARK & ASSOCIATES LTD.

(57) ABSTRACT

A signal generation apparatus includes a glitch rejection circuit including n m-stage inverters coupled in series, and configured to receive an input signal and perform an inverting operation on the input signal, based on a plurality of voltage signals, to generate an output signal and adjust switching threshold voltages of the m-stage inverters, based on the plurality of voltage signals, to generate the glitch-removed output signal, when a glitch occurs in the input signal, a level detection circuit to detect a logic level of the output signal provided from the glitch rejection circuit to generate a level detection signal and a complementary level detection signal, and a voltage signal generation circuit configured to receive the input signal, a complementary input signal, the level detection signal, and the complementary level detection signal to generate the plurality of voltage signals and provide the plurality of voltage signals to the glitch rejection circuit.

21 Claims, 7 Drawing Sheets

120-2

SIGNAL GENERATION APPARATUS CAPABLE OF REJECTING NOISE

CROSS-REFERENCES TO RELATED APPLICATION

The present application claims priority under 35 U.S.C. § 119(a) to Korean Patent Application Number 10-2021-0188509, filed on Dec. 27, 2021, in the Korean Intellectual Property Office, which is incorporated herein by reference in its entirety.

BACKGROUND

1. Technical Field

Various embodiments may generally relate to integrated circuit technology, and more particularly, to a signal generation apparatus capable of rejecting a glitch or noise.

2. Related Art

Electronic devices may include many electronic elements and a computer system among the electronic elements may include many semiconductor devices configured of semiconductor elements. The semiconductor devices constituting the computer system may transmit and receive a clock signal and data therebetween to communicate with each other. The semiconductor devices may include buffer circuits which amplify and/or buffer input signals to generate output signals. The general buffer circuit may be a differential amplifier which performs differential amplification on a positive input signal and a negative input signal to generate an output signal. A glitch may be undesired pulse noise in a digital signal and cause an erroneous output or a spontaneous error in a digital system, and therefore, there is a need for a method for filtering the glitch

SUMMARY

In an embodiment of the present disclosure, a signal generation apparatus may include: a glitch rejection circuit including n m-stage inverters (where, n is a natural number and m is an even number greater than or equal to 2) coupled in series, and configured to receive an input signal and perform an inverting operation on the input signal, based on a plurality of voltage signals, to generate an output signal and adjust switching threshold voltages of the m-stage inverters, based on the plurality of voltage signals, to generate the glitch-removed output signal, when a glitch occurs in the input signal; a level detection circuit configured to detect a logic level of the output signal provided from the glitch rejection circuit to generate a level detection signal and a complementary level detection signal; and a voltage signal generation circuit configured to receive the input signal, a complementary input signal, the level detection signal, and the complementary level detection signal to generate the plurality of voltage signals and provide the plurality of voltage signals to the glitch rejection circuit.

In an embodiment of the present disclosure, a signal generation apparatus may include: a first inverting circuit configured to invert an input signal to generate a complementary input signal based on first and second gate voltage signals, wherein a switching threshold voltage of the first inverting circuit is adjusted based on a first control voltage signal when a glitch occurs in the input signal; a second inverting circuit configured to invert the complementary input signal received from the first inverting circuit to generate an output signal based on third and fourth gate voltage signals, wherein a switching threshold voltage of the second inverting circuit is adjusted based on a second control voltage signal when a glitch occurs in the complementary input signal; a level detection circuit configured to generate clock pulses at a rising edge and a falling edge of the output signal received from the second inverting circuit, detect a logic level of the output signal to generate a level detection signal and a complementary level detection signal based on the clock pulses; and a voltage signal generation circuit configured to, based on the level detection signal and the complementary level detection signal received from the level detection circuit, generate the first and second control voltage signal, the first and second gate voltage signals, and the third and fourth gate voltage signals having a first power voltage level or a second power voltage level and provide the generated voltage signals to the first and second inverting circuits.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present teachings are described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, embodiments of the present teachings should not be construed as limiting the present teachings.

Although a few embodiments of the present teachings are shown and described, it will be appreciated by those of ordinary skill in the art that changes may be made in these embodiments without departing from the principles and spirit of the present teachings.

Hereinafter, embodiments of the present technology will be described in detail with reference to the accompanying drawings.

In the description of the present disclosure, the terms "first" and "second" may be used to describe various components, but the components are not limited by the terms. The terms may be used to distinguish one component from another component. For example, a first component may be called a second component and a second component may be called a first component without departing from the scope of the present disclosure.

Figure 1:
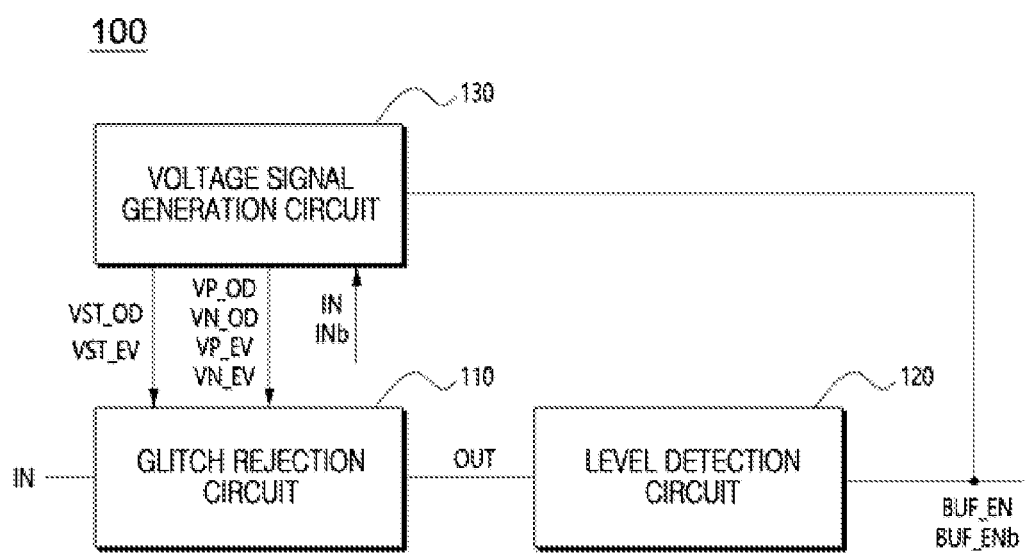
FIG. 1 is a diagram illustrating a configuration of a signal generation apparatus according to an embodiment of the present disclosure.

FIG. 1 is a diagram illustrating a configuration of a signal generation apparatus 100 according to an embodiment of the present disclosure.

Referring to FIG. 1, the signal generation apparatus 100 may receive an input signal IN and generate an output signal OUT.

When a glitch (noise) occurs in the input signal IN, the signal generation apparatus 100 may regulate a pulse width of the glitch (noise) by increasing switching threshold voltages of transistors constituting the signal generation apparatus 100 based on voltage signals generated in the inside thereof.

The signal generation apparatus 100 may detect a logic level, for example, transition of a logic level of the output signal OUT and generate a level detection signal BUF_EN and a complementary signal BUF_ENb of the level detection signal BUF_EN (hereinafter, referred to as 'complementary level detection signal BUF_ENb').

The signal generation apparatus 100 may generate a plurality of voltage signals according to the input signal IN, a complementary signal INb of the input signal IN (hereinafter, referred to as 'complementary input signal INb'), the level detection signal BUF_EN, and the complementary level detection signal BUF_ENb. The plurality of voltage signals may include a plurality of control voltage signals and a plurality of gate voltage signals.

For example, the plurality of control voltage signals may include an odd control voltage signal VST_OD as a first control voltage signal and an even control voltage signal VST_EV as a second control voltage signal. The plurality of gate voltage signals may include a plurality of odd gate voltage signals VP_OD and VN_OD and a plurality of even gate voltage signals VP_EV and VN_EV. The plurality of odd gate voltage signals VP_OD and VN_OD may include a first odd gate voltage signal VP_OD and a second odd gate voltage signal VN_OD, and the plurality of even gate voltage signals VP_EV and VN_EV may include a first even gate voltage signal VP_EV and a second even gate voltage signal VN_EV.

The signal generation apparatus 100 may receive the input signal IN, and invert the input signal IN to generate the output signal OUT based on the plurality of gate voltage signals, for example, the first and second odd gate voltage signals VP_OD and VN_OD and the first and second even gate voltage signals VP_EV and VN_EV. At this time, when a glitch occurs in the input signal IN, the signal generation apparatus 100 may remove the glitch of the input signal IN based on the plurality of control voltage signals, for example, the odd and even control voltage signals VST_OD and VST_EV and generate the glitch-removed (glitch-free) output signal OUT.

The signal generation apparatus 100 may include a glitch rejection circuit 110, a level detection circuit 120, and a voltage signal generation circuit 130.

The glitch rejection circuit 110 may receive the input signal IN, remove a glitch of the input signal IN, and generate the output signal OUT. The level detection circuit 120 may receive the output signal OUT, detect level transition of the output signal OUT, and generate the level detection signal BUF_EN and the complementary level detection signal BUF_ENb. The voltage signal generation circuit 130 may receive the input signal IN provided from the outside of the signal generation apparatus 100, the complementary input signal INb provided from the glitch rejection circuit 110, and the level detection signal BUF_EN and the complementary level detection signal BUF_ENb provided from the level detection circuit 120 to generate the plurality of voltage signals VST_OD and VST_EV, VP_OD and VN_OD, and VP_EV and VN_EV, and provide the plurality of voltage signals VST_OD and VST_EV, VP_OD and VN_OD, and VP_EV and VN_EV to the glitch rejection circuit 110.

The glitch rejection circuit 110 may receive the input signal IN, and generate the output signal OUT based on the odd and even control voltage signals VST_OD and VST_EV, the first and second odd gate voltage signals VP_OD and VN_OD, and the first and second even gate voltage signals VP_EV and VN_EV provided from the voltage signal generation circuit 130.

Figure 6:
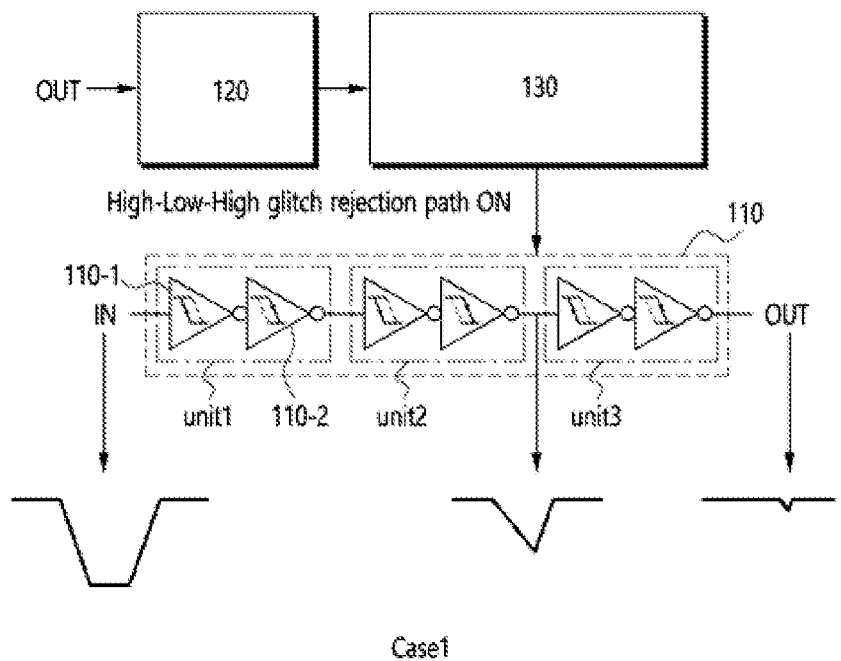
FIG. 6 is a diagram illustrating an operation of reducing a glitch/noise in a signal generation apparatus according to an embodiment of the present disclosure.
Figure 6:
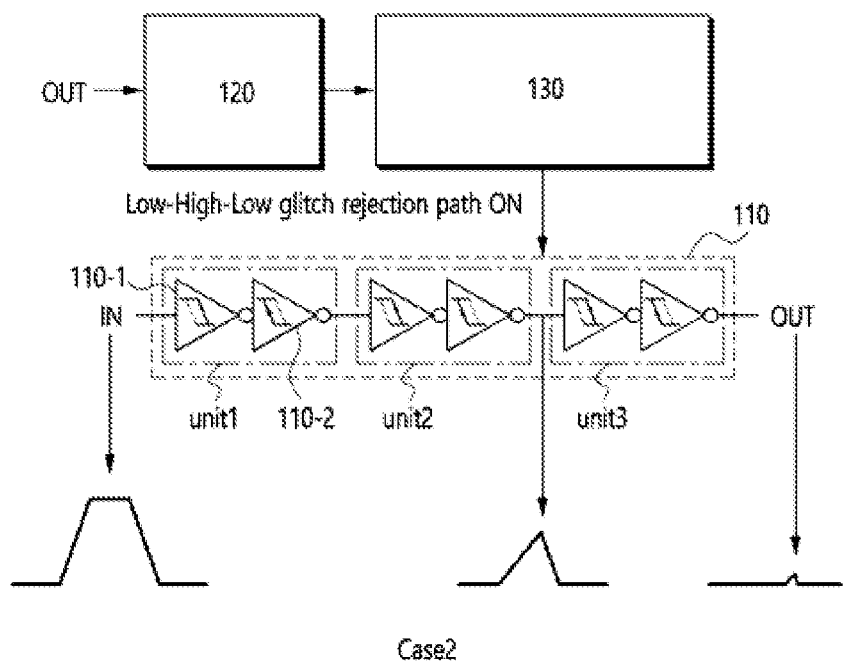

The glitch rejection circuit 110 may be configured of a m-stage (where, m is an even number greater than or equal to 2) inverter. For example, the glitch rejection circuit 110 may be configured of a two-stage inverter including first and second inverting circuits 111 and 112 to be described later. The two-stage inverter may include two inverters, for example, two Schmitt trigger inverters, coupled in series, which are corresponding to the first and second inverting circuits 111 and 112, respectively. Although it has been illustrated in the embodiment that the glitch rejection circuit 110 is configured of the single two-stage inverter including the two Schmitt trigger inverters coupled in series, but this is not limited thereto. In another embodiment, the glitch rejection circuit 110 may be configured of n m-stage Schmitt trigger inverts (where, n is a natural number) coupled in series. For example, the glitch rejection circuit 110 may be configured of 3 two-stage Schmitt trigger inverters coupled in series, as illustrated in FIG. 6. In another example, the glitch rejection circuit 110 may be configured of a single m-stage Schmitt trigger inverter, for example, a 4-stage Schmitt trigger inverter.

Switching threshold voltages of the two Schmitt trigger inverters of the two-stage inverter constituting the glitch rejection circuit 110 may be controlled based on the control voltage signals VST_OD and VST_EV. For example, in the two-stage inverter, a switching threshold voltage of a first stage Schmitt trigger inverter may be controlled to be increased based on the odd control voltage signal VST_OD, and a switching threshold voltage of a second stage Schmitt trigger inverter may be controlled to be increased based on the even control voltage signal VST_EV.

The signal generation apparatus 100 according to an embodiment may control the switching threshold voltages of the two Schmitt trigger inverters in the two-stage inverter of the glitch rejection circuit 110 based on the odd control voltage signal VST_OD of a first power voltage VDD level applied to the first stage Schmitt trigger inverter of the two-stage inverter and the even control voltage signal VST_EV of a second power voltage VSS level applied to the second stage Schmitt trigger inverter of the two-stage inverter when a glitch occurs in the input signal IN of a logic low level, for example, a low-high-low short pulse glitch occurs (see Case 2 in FIG. 6). Hereinafter, the operation of inverting the input signal of the logic low (0) level as a first logic level to generate the output signal based on the gate voltage signals VP_OD, VP_EV, VN_OD, and VN_EV, and rejecting a glitch transited from the logic low level to a logic high (1) level as a second logic level occurring in the input signal of the logic low level based on the odd and even control voltage signals VST_OD and VST_EV may be referred to as a first operation mode in the embodiment.

Further, the signal generation apparatus 100 according to an embodiment may control the switching threshold voltages of the two Schmitt trigger inverters in the two-stage inverter based on the odd control voltage signal VST_OD of the second power voltage VSS level applied to the first stage Schmitt trigger inverter of the two-stage inverter and the even control voltage signal VST_EV of the first power voltage VDD level applied to the second stage Schmitt trigger inverter of the two-stage inverter when a glitch occurs in the input signal IN of the logic high level, for example, a high-low-high short pulse glitch occurs (see Case 1 in FIG. 6). Hereinafter, the operation of inverting the input signal IN of the logic high (1) level to generate the output signal OUT based on the gate voltage signals VP_OD, VP_EV, VN_OD, and VN_EV, and rejecting a glitch transitioned from the logic high level to a logic low level occurring in the input signal IN of the logic high level based on the odd and even control voltage signals VST_OD and VST_EV may be referred to as a second operation mode in the embodiment.

In the first operation mode, an upper triggering point (UTP) of the first stage Schmitt trigger inverter of the two-stage inverter may be controlled based on the odd control voltage signal VST_OD of the first power voltage VDD level, and a lower triggering point (LTP) of the second stage Schmitt trigger inverter of the two-stage inverter may be controlled based on the even control voltage signal VST_EV of the second power voltage VSS level.

In the second operation mode, a lower triggering point (LTP) of the first stage Schmitt trigger inverter of the two-stage inverter may be controlled based on the odd control voltage signal VST_OD of the second power voltage VSS level, and an upper triggering point (UTP) of the second stage Schmitt trigger inverter of the two-stage inverter may be controlled based on the even control voltage signal VST_EV of the first power voltage VDD level.

Accordingly, in the first and second operation modes, based on the odd control voltage signal VST_OD and the even control voltage signal VST_EV, which are generated based on the level detection signal BUF_EN and the complementary level detection signal BUF_ENb, the signal generation apparatus 100 may control the switching threshold voltages of the first stage Schmitt trigger inverter and the second stage Schmitt trigger inverter to be increased and thus regulate the pulse widths of glitches. For example, the signal generation apparatus 100 may control the pulse widths of glitches to be increasingly reduced and thus to generate the glitch-removed output signal OUT, as illustrated in FIG. 6.

The level detection circuit 120 may receive the output signal OUT from the glitch rejection circuit 110 and generate the level detection signal BUF_EN and the complementary level detection signal BUF_ENb.

The level detection circuit 120 may receive the output signal OUT from the glitch rejection circuit 110 and detect a level of the output signal OUT. For example, the level detection circuit 120 may detect level transition of the output signal OUT according to the glitch of the input signal IN. The level detection circuit 120 may generate the level detection signal BUF_EN and the complementary level detection signal BUF_ENb according to a level transition detection result and provide the generated level detection signal BUF_EN and complementary level detection signal BUF_ENb to the voltage signal generation circuit 130.

The voltage signal generation circuit 130 may receive the input signal IN and the complementary input signal INb, and the level detection signal BUF_EN and the complementary level detection signal BUF_ENb which are generated based on the level transition detection result of the output signal in the level detection circuit 120. The voltage signal generation circuit 130 may generate the plurality of voltage signals, for example, the odd control voltage signal VST_OD and the even control voltage signal VST_EV, the first and second odd gate voltage signals VP_OD and VN_OD, and the first and second even gate voltage signals VP_EV and VN_EV, and provide the plurality of voltage signals to the glitch rejection circuit 110.

In the first operation mode, the voltage signal generation circuit 130 may provide the odd control voltage signal VST_OD of the first power voltage VDD level and the even control voltage signal VST_EV of the second power voltage VSS level, based on the level detection signal BUF_EN and the complementary level detection signal BUF_ENb provided from the level detection circuit 120. For example, the voltage signal generation circuit 130 may provide the odd control voltage signal VST_OD to the first stage inverter of the two-stage inverter, for example, an odd-numbered inverter of each of the n m-stage inverters, in the glitch rejection circuit 110, and provide the even control voltage signal VST_EV to the second stage inverter of the two-stage inverter, for example, an even-numbered inverter of each of the n m-stage inverters, in the glitch rejection circuit 110. Accordingly, based on the level detection signal BUF_EN of the logic low level, the voltage signal generation circuit 130 may provide the first power voltage VDD level signal as the odd control voltage signal VST_OD to the odd-numbered inverter, and the second power voltage VSS level signal as the even control voltage signal VST_EV to the even-numbered inverter, in the first operation mode.

In the second operation mode, the voltage signal generation circuit 130 may provide the odd control voltage signal VST_OD of the second power voltage VSS level and the even control voltage signal VST_EV of the first power voltage VDD level, based on the level detection signal BUF_EN and the complementary level detection signal BUF_ENb provided from the level detection circuit 120. For example, the voltage signal generation circuit 130 may provide the odd control voltage signal VST_OD to the first stage inverter of the two-stage Inverter, for example, an odd-numbered inverter of each of the n m-stage inverter, in the glitch rejection circuit 110, and provide the even control voltage signal VST_EV to the second stage inverter of the two-stage inverter, for example, an even-numbered inverter of each of the n m-stage inverter, in the glitch rejection circuit 110. Accordingly, based on the level detection signal BUF_EN of the logic high level, the voltage signal generation circuit 130 may provide the second power voltage VSS level signal as the odd control voltage signal VST_OD to the odd-numbered inverter, and provide the first power voltage VDD level signal as the even control voltage signal VST_EV to the even-numbered inverter, in the second operation mode.

Figure 2:
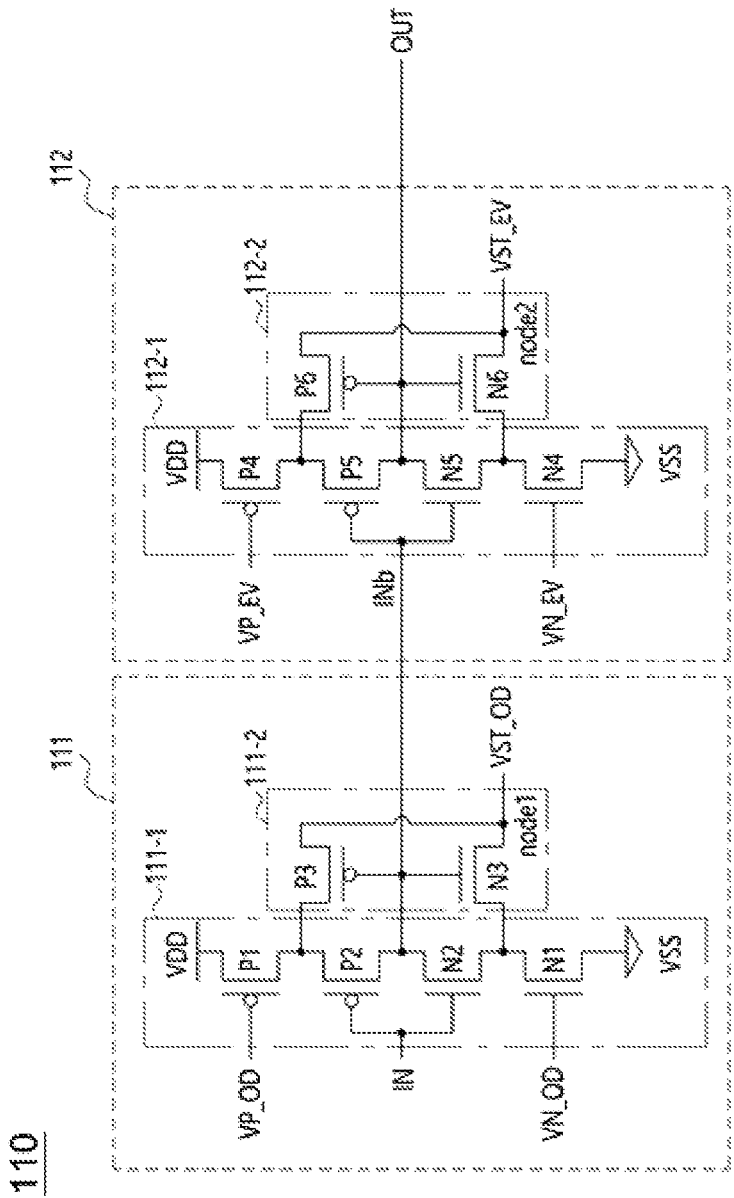
FIG. 2 is a diagram illustrating a configuration of a glitch rejection circuit according to an embodiment of the present disclosure.

FIG. 2 is a diagram illustrating a configuration of the glitch rejection circuit 110 according to an embodiment of the present disclosure.

Referring to FIG. 2, the glitch rejection circuit 110 may receive the input signal IN, the odd and even control voltage signals VST_OD and VST_EV, the first odd and even gate voltage signals VP_OD and VP_EV, and the second odd and even gate voltage signals VN_OD and VN_EV, and generate the output signal OUT based on the plurality of voltage signals.

The odd and even control voltage signals VST_OD and VST_EV, the first odd and even gate voltage signals VP_OD and VP_EV, and the second odd and even gate voltage signals VN_OD and VN_EV may be operation control signals for internal circuit operations, for example, an output signal generation operation, a glitch rejection operation, and the like, in the glitch rejection circuit 110.

The glitch rejection circuit 110 may include the first inverting circuit 111 and the second inverting circuit 112. The first inverting circuit 111 may be the first stage inverter configured of a Schmitt trigger inverter, for example, the odd-numbered inverter, and the second Inverting circuit 112 may be the second stage inverter configured of a Schmitt trigger inverter, for example, the even-numbered inverter. In an embodiment, a first inverting circuit 111 may be an odd-numbered inverting circuit and a second inverting circuit 112 may be an even-numbered inverting circuit.

For example, the glitch rejection circuit 110 may include the first inverting circuit 111 configured to receive the input signal IN and invert the input signal IN to generate the complementary input signal INb, and the second inverting circuit 112 configured to receive the complementary input signal INb from the first inverting circuit 111 and invert the complementary input signal INb to generate the output signal OUT.

When a glitch occurs in the input signal IN, the first and second inverting circuits 111 and 112 may increase the switching threshold voltage of transistors included therein based on the odd control voltage signal VST_OD and the even control voltage signal VST_EV to control a pulse width of the glitch to be reduced.

The first inverting circuit 111 may receive the odd control voltage signal VST_OD, the first odd gate voltage signal VP_OD, and the second odd gate voltage signal VN_OD, which have the first power voltage VDD level or the second power voltage VSS level, from the voltage signal generation circuit 130. The first inverting circuit 111 may invert the input signal IN based on the first odd gate voltage signal VP_OD and the second odd gate voltage signal VN_OD to generate the complementary input signal INb, and control the switching threshold voltages of the transistors included therein based on the odd control voltage signal VST_OD.

For example, in the first operation mode that a glitch transited from the logic low level to the logic high level occurs in the input signal IN of the logic low level, switching threshold voltages of NMOS transistors N1 and N2 of the first inverting circuit 111 may be increased by the odd control voltage signal VST_OD of the first power voltage VDD level applied to the first inverting circuit 111, the level transition time of a glitch in the input signal IN may be increased, and thus a pulse width of the glitch in the input signal IN may be reduced.

Further, in the second operation mode that a glitch transited from the logic high level to the logic low level occurs in the input signal IN of the logic high level, switching threshold voltages of PMOS transistors P1 and P2 of the first inverting circuit 111 may be increased by the odd control voltage signal VST_OD of the second power voltage VSS level applied to the first inverting circuit 111, the level transition time of a glitch of the input signal IN may be increased, and thus a pulse width of the glitch in the input signal IN may be reduced.

The first inverting circuit 111 may include a first inverter 111-1 and a first adjuster 111-2. In an embodiment, a first inverter 111-1 may be an odd-numbered inverter and a first adjuster 111-2 may be an odd-numbered adjuster.

For example, the first inverting circuit 111 may include the first inverter 111-1 configured to receive the input signal IN, invert the input signal IN based on the first and second odd gate voltage signals VP_OD and VN_OD, and generate the complementary input signal INb, and the first adjuster 111-2 configured to adjust the switching threshold voltage of the first inverter 111-1 based on the odd control voltage signal VST_OD.

The first inverter 111-1 may include a first PMOS transistor P1 and a second PMOS transistor P2 coupled in series between a first power voltage VDD terminal and a complementary input signal INb terminal, and a first NMOS transistor N1 and a second NMOS transistor N2 coupled in series between the complementary input signal INb terminal and a second power voltage VSS terminal. The first adjuster 111-2 may include a third PMOS transistor P3 and a third NMOS transistor N3.

For example, the first inverter 111-1 may include the first and second PMOS transistors P1 and P2 configured to invert the input signal IN of the logic low level based on the first odd gate voltage signal VP_OD and allow the complementary input signal INb of the logic high level to be generated in the first operation mode. The first inverter 111-1 may further include the first and second NMOS transistors N1 and N2 configured to invert the input signal IN of the logic high level based on the second odd gate voltage signal VN_OD and allow the complementary input signal INb of the logic low level to be generated in the second operation mode.

Further, the first adjuster 111-2 may include the third PMOS transistor P3 configured to adjust the switching threshold voltages of the first and second PMOS transistors P1 and P2 based on the odd control voltage signal VST_OD, which is provided from the voltage signal generation circuit 130 through a first node node1, in the second operation mode that a glitch transited from the logic high level to the logic low level, for example, a high-low-high short pulse glitch occurs in the input signal IN of the logic high level. The first adjuster 111-2 may further include the third NMOS transistor N3 configured to adjust the switching threshold voltages of the first and second NMOS transistors N1 and N2 based on the odd control voltage signal VST_OD, which is provided from the voltage signal generation circuit 130 through the first node node1, in the first operation mode that a glitch transited from the logic low level to the logic high level, for example, a low-high-low short pulse glitch occurs in the input signal IN of the logic low level.

When a high-low-high short pulse glitch occurs in the input signal IN of the logic high level, the odd control voltage signal VST_OD of the second power voltage VSS level may be applied to the third PMOS transistor P3 of the first adjuster 111-2 through the first node node1, and thus the switching threshold voltages of the first and second PMOS transistors P1 and P2 of the first inverter 111-1 may be increased and the level transition time of the glitch may be increased. Further, when a low-high-low short pulse glitch occurs in the input signal IN of the logic low level, the odd control voltage signal VST_OD of the first power voltage VDD level may be applied to the third NMOS transistor N3 of the first adjuster 111-2 through the first node node1, and thus the switching threshold voltages of the first and second NMOS transistors N1 and N2 of the first inverter 111-1 may be increased and the level transition time of the glitch may be increased.

In the first inverter 111-1, the first power voltage VDD may be applied to a source of the first PMOS transistor P1 and the first odd gate voltage signal VP_OD may be applied to a gate of the first PMOS transistor P1. The input signal IN may be applied to a gate of the second PMOS transistor P2 and a source of the second PMOS transistor P2 may be coupled to a drain of the first PMOS transistor P1.

Further, the second power voltage VSS may be applied to a source of the first NMOS transistor N1, and the second odd gate voltage signal VN_OD may be applied to a gate of the first NMOS transistor N1. The input signal IN may be applied to a gate of the second NMOS transistor N2, a source of the second NMOS transistor N2 may be coupled to a drain of the first NMOS transistor N1, and a drain of the second NMOS transistor N2 may be coupled to a drain of the second PMOS transistor P2.

In the first adjuster 111-2, the third PMOS transistor P3 may be coupled between a connection node of the first PMOS transistor P1 and the second PMOS transistor P2 and the first node node1 and a gate of the third PMOS transistor P3 may be coupled to a connection node of the second PMOS transistor P2 and the second NMOS transistor N2 which is the complementary input signal INb terminal.

Further, the third NMOS transistor N3 may be coupled between a connection node of the first NMOS transistor N1 and the second NMOS transistor N2 and the first node node1 and a gate of the third NMOS transistor N3 may be coupled to the connection node of the second PMOS transistor P2 and the second NMOS transistor N2 which is the complementary input signal INb terminal.

In the first operation mode, the input signal IN of the logic low level may be received in the first inverting circuit 111, and the first and second PMOS transistors P1 and P2, which are coupled in series and the first odd gate voltage signal VP_OD of the second power voltage VSS level and the input signal IN are applied to the gates thereof, may be enabled. The first and second NMOS transistors N1 and N2, which are coupled in series and the input signal IN and the second odd gate voltage signal VN_OD of the second power voltage VSS level are applied to the gates thereof, may be disabled. Accordingly, the first inverting circuit 111 may generate the complementary input signal INb of the logic high level. At this time, the third NMOS transistor N3, to which the odd control voltage signal VST_OD of the first power voltage VDD level is applied through the first node node1, may be enabled, and the third PMOS transistor P3, to which the odd control voltage signal VST_OD of the first power voltage VDD level is applied through the first node node1, may be disabled.

When a glitch transited from the logic low level to the logic high level, for example, a low-high-low short pulse glitch occurs in the input signal IN, the first and second NMOS transistors N1 and N2 may be enabled. Accordingly, the switching threshold voltages of the first and second NMOS transistors N1 and N2 may be increased based on the odd control voltage signal VST_OD of the first power voltage VDD level, which is provided to the third NMOS transistor N3 through the first node node1, and the pulse width of the glitch in the input signal IN may be reduced according to increase in transition time of the glitch in the input signal IN from the logic low level to the logic high level.

Further, in the second operation mode, the input signal IN of the logic high level may be received in the first inverting circuit 111, and the first and second NMOS transistors N1 and N2, which are coupled in series and the input signal IN and the second odd gate voltage signal VN_OD of the first power voltage VDD level are applied to the gates thereof, may be enabled. The first and second PMOS transistors P1 and P2, which are coupled in series and the input signal IN and the first odd gate voltage signal VP_OD of the first power voltage VDD level are applied to the gates thereof, may be disabled. Accordingly, the first inverting circuit 111 may generate the complementary input signal INb of the logic low level. At this time, the third NMOS transistor N3, to which the odd control voltage signal VST_OD of the second power voltage VSS level is applied through the first node node1, may be disabled, and the third PMOS transistor P3, to which the odd control voltage signal VST_OD of the second power voltage VSS level is applied through the first node node1, may be enabled.

When a glitch transited from the logic high level to the logic low level, for example, a high-low-high short pulse glitch occurs in the input signal IN, the first and second PMOS transistors P1 and P2 may be enabled. Accordingly, the switching threshold voltages of the first and second PMOS transistors P1 and P2 may be increased based on the odd control voltage signal VST_OD of the second power voltage VSS level, which is provided to the third PMOS transistor P3 through the first node node1, transition time of the glitch in the input signal IN from the logic high level to the logic low level may be increased in advance, and thus the pulse width of the glitch in the input signal IN may be reduced.

The second inverting circuit 112 may receive the even control voltage signal VST_EV, the first even gate voltage signal VP_EV, and the second even gate voltage signal VN_EV, which have the first power voltage VDD level or the second power voltage VSS level, from the voltage signal generation circuit 130. The second inverting circuit 112 may invert the complementary input signal INb as an input signal based on the first even gate voltage signal VP_EV and the second even gate voltage signal VN_EV to generate the output signal OUT, and control the switching threshold voltages of the transistors included therein based on the even control voltage signal VST_EV.

For example, when a glitch transited from the logic high level to the logic low level occurs in the complementary input signal INb of the logic high level which is received from the first inverting circuit 111, switching threshold voltages of PMOS transistors P4 and P5 of the second inverting circuit 112 may be increased by the even control voltage signal VST_EV of the second power voltage VSS level applied to the second inverting circuit 112, the level transition time of a glitch in the complementary input signal INb may be increased, and thus a pulse width of the glitch in the complementary input signal INb may be reduced.

Further, when a glitch transited from the logic low level to the logic high level occurs in the complementary input signal INb of the logic low level received from the first inverting circuit 111, switching threshold voltages of NMOS transistors N4 and N5 of the second inverting circuit 112 may be additionally increased by the even control voltage signal VST_EV of the first power voltage VDD level applied to the second inverting circuit 112, the level transition time of a glitch of the complementary input signal INb may be increased, and thus a pulse width of the glitch in the complementary input signal INb may be reduced.

The second inverting circuit 112 may include a second inverter 112-1 and a second adjuster 112-2. In an embodiment, a second inverter 112-1 may be an even-numbered inverter and a second adjuster 112-2 may be an even-numbered adjuster.

For example, the second inverting circuit 112 may include the second inverter 112-1 configured to receive the complementary input signal INb from the first inverting circuit 111, invert the complementary input signal INb based on the first and second even gate voltage signals VP_EV and VN_EV, and generate the output signal OUT, and the second adjuster 112-2 configured to adjust the switching threshold voltage of the second inverter 112-1, based on the even control voltage signal VST_EV.

The second inverter 112-1 may include a fourth PMOS transistor P4 and a fifth PMOS transistor P5 coupled in series between the first power voltage VDD terminal and an output signal OUT terminal, and a fourth NMOS transistor N4 and a fifth NMOS transistor N5 coupled in series between the output signal OUT terminal and the second power voltage VSS terminal. The second adjuster 112-2 may include a sixth PMOS transistor P6 and a sixth NMOS transistor N6.

For example, the second inverter 112-1 may include the fourth and fifth PMOS transistors P4 and P5 configured to invert, when the complementary input signal INb is the logic low level, the complementary input signal INb based on the first even gate voltage signal VP_EV and allow the output signal OUT of the logic high level to be generated. The second inverter 112-1 may further include the fourth and fifth NMOS transistors N4 and N5 configured to invert, when the complementary input signal INb is the logic high level, the complementary input signal INb based on the second even gate voltage signal VN_EV and allow the output signal OUT of the logic low level to be generated.

Further, the second adjuster 112-2 may include the sixth PMOS transistor P6 configured to adjust the switching threshold voltages of the fourth and fifth PMOS transistors P4 and P5 based on the even control voltage signal VST_EV, which is provided from the voltage signal generation circuit 130 through a second node node2, when a glitch transited from the logic high level to the logic low level occurs in the complementary input signal INb of the logic high level, for example, when a high-low-high short pulse glitch occurs in the complementary input signal INb of the logic high level. The second adjuster 112-2 may further include the sixth NMOS transistor N6 configured to adjust the switching threshold voltages of the fourth and fifth NMOS transistors N4 and N5 based on the even control voltage signal VST_EV, which is provided from the voltage signal generation circuit 130 through the second node node2, when a glitch transited from the logic low level to the logic high level occurs in the complementary input signal INb of the logic low level, for example, when a low-high-low short pulse glitch occurs in the complementary input signal INb of the logic low level.

When a high-low-high short pulse glitch occurs in the complementary input signal INb of the logic high level, the switching threshold voltages of the fourth and fifth PMOS transistors P4 and P5 of the second inverter 112-1 may be increased based on the even control voltage signal VST_EV of the second power voltage VSS level applied to the sixth PMOS transistor P6 of the second adjuster 112-2 through the second node node2, and thus and the level transition time of the glitch may be increased. Further, when a low-high-low short pulse glitch occurs in the complementary input signal INb of the logic low level, the switching threshold voltages of the fourth and fifth NMOS transistors N4 and N5 of the second inverter 112-1 may be increased based on the even control voltage signal VST_EV of the first power voltage VDD level applied to the sixth NMOS transistor N6 of the second adjuster 112-2 through the second node node2, and the level transition time of the glitch may be increased.

In the second inverter 112-1, the first power voltage VDD may be applied to a source of the fourth PMOS transistor P4 and the first even gate voltage signal VP_EV may be applied to a gate of the fourth PMOS transistor P4. The complementary input signal INb may be applied to a gate of the fifth PMOS transistor P5 and a source of the fifth PMOS transistor P5 may be coupled to a drain of the fourth PMOS transistor P4.

Further, the second power voltage VSS may be applied to a source of the fourth NMOS transistor N4, and the second even gate voltage signal VN_EV may be applied to a gate of the fourth NMOS transistor N4. The complementary input signal INb may be applied to a gate of the fifth NMOS transistor N5, a source of the fifth NMOS transistor N5 may be coupled to a drain of the fourth NMOS transistor N4, and a drain of the fifth NMOS transistor N5 may be coupled to a drain of the fifth PMOS transistor P5.

In the second adjuster 112-2, the sixth PMOS transistor P6 may be coupled between a connection node of the fourth PMOS transistor P4 and the fifth PMOS transistor P5 and the second node node2 and a gate of the sixth PMOS transistor P6 may be coupled to a connection node of the fifth PMOS transistor P5 and the fifth NMOS transistor N5 which is the output signal OUT terminal.

Further, the sixth NMOS transistor N6 may be coupled between a connection node of the fourth NMOS transistor N4 and the fifth NMOS transistor N5 and the second node node2 and a gate of the sixth NMOS transistor N6 may be coupled to the connection node of the fifth PMOS transistor P5 and the fifth NMOS transistor N5 which is the output signal OUT terminal.

In the first operation mode, the complementary input signal INb of the logic high level may be received in the second inverting circuit 112, the fourth and fifth NMOS transistors N4 and N5, which are coupled in series and the complementary input signal INb and the second even gate voltage signal VN_EV of the first power voltage VDD level are applied to the gates thereof, may be enabled. The fourth and fifth PMOS transistors P4 and P5, which are coupled in series and the complementary input signal INb and the first even gate voltage signal VP_EV of the first power voltage VDD level are applied to the gates thereof, may be disabled. Accordingly, the second inverting circuit 112 may generate the output signal OUT of the logic low level. At this time, the sixth PMOS transistor P6, to which the even control voltage signal VST_EV of the second power voltage VSS level is applied through the second node node2, may be enabled, and the sixth NMOS transistor N6, to which the even control voltage signal VST_EV of the second power voltage VSS level is applied through the second node node2, may be disabled.

When a glitch transited from the logic high level to the logic low level occurs in the complementary input signal INb, the fourth and fifth PMOS transistors P4 and P5 may be enabled. Accordingly, the switching threshold voltages of the fourth and fifth PMOS transistors P4 and P5 may be increased based on the even control voltage signal VST_EV of the second power voltage VSS level, which is provided to the sixth PMOS transistor P6 through the second node node2, transition time of the glitch in the complementary input signal INb from the logic high level to the logic low level may be increased in advance, and this the pulse width of the glitch in the complementary input signal INb may be reduced.

Further, in the second operation mode, the complementary input signal INb of the logic low level may be received in the second inverting circuit 112, the fourth and fifth PMOS transistors P4 and P5, which are coupled in series and the complementary input signal INb and the first even gate voltage signal VP_EV of the second power voltage VSS level are applied to the gates thereof, may be enabled. The fourth and fifth NMOS transistors N4 and N5, which are coupled in series and the complementary input signal INb and the second even gate voltage signal VN_EV of the second power voltage VSS level are applied to the gates thereof, may be disabled. Accordingly, the second inverting circuit 112 may generate the output signal OUT of the logic high level. At this time, the sixth NMOS transistor N6, to which the even control voltage signal VST_EV of the first power voltage VDD level is applied through the second node node2, may be enabled, and the sixth PMOS transistor P6, to which the even control voltage signal VST_EV of the first power voltage VDD level is applied through the second node node2, may be disabled.

When a glitch transited from the logic low level to the logic high level occurs in the complementary input signal INb, the fourth and fifth NMOS transistors N4 and N5 may be enabled. Accordingly, the switching threshold voltages of the fourth and fifth NMOS transistors N4 and N5 may be increased based on the even control voltage signal VST_EV of the first power voltage VDD level, which is provided to the sixth NMOS transistor N6 through the second node node2, and the pulse width of the glitch in the complementary input signal INb may be reduced according to increase in transition time of the glitch in the complementary input signal INb from the logic low level to the logic high level.

Figure 3:
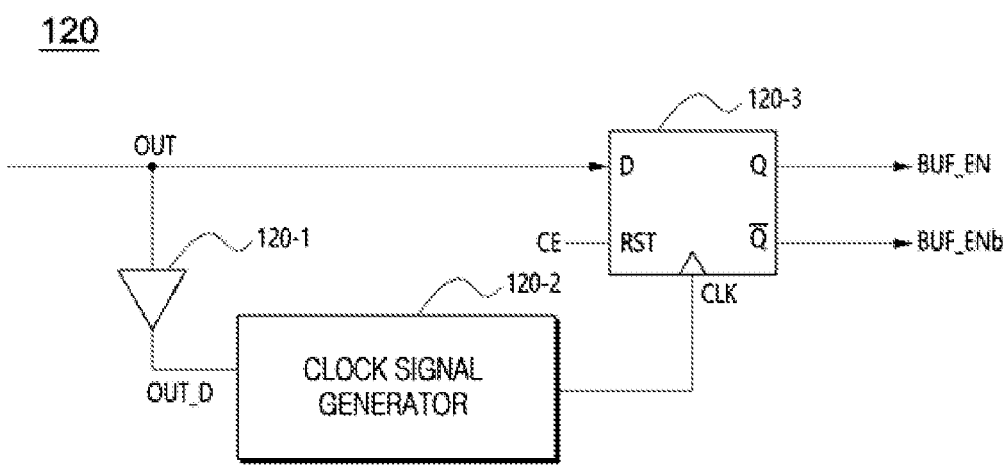
FIG. 3 is a diagram illustrating a configuration of a level detection circuit according to an embodiment of the present disclosure.

FIG. 3 is a diagram illustrating a configuration of the level detection circuit 120 according to an embodiment of the present disclosure.

Referring to FIG. 3, the level detection circuit 120 may receive the output signal OUT, detect a level transition of the output signal OUT, and generate the level detection signal BUF_EN and the complementary level detection signal BUF_ENb.

The level detection circuit 120 may include a delay buffer 120-1, a clock signal generator 120-2, and a level detection signal generator 120-3.

The delay buffer 120-1 may receive the output signal OUT, delay the output signal OUT, and generate a delayed output signal OUT_D. The delay buffer 120-1 may be configured to prevent or mitigate a setup violation of the level detection signal generator 120-3 when the level detection circuit 120 receives the output signal OUT to generate a clock signal CLK.

The clock signal generator 120-2 may generate the clock signal CLK based on the delayed output signal OUT_D. The clock signal generator 120-2 may receive the delayed output signal OUT_D to generate the clock signal CLK and provide the generated clock signal CLK to the level detection signal generator 120-3. A detailed description of the clock signal generator 120-2 will be made with reference to FIG. 4 later.

The level detection signal generator 120-3 may generate the level detection signal BUF_EN and the complementary level detection signal BUF_ENb based on the clock signal CLK.

The level detection signal generator 120-3 may include a flip-flop, for example, a D flip flop. The D flip flop may receive the output signal OUT from the glitch rejection circuit 110 through an input terminal D, receive the clock signal CLK from the clock signal generator 120-2 through a clock terminal, and output the level detection signal BUF_EN and the complementary level detection signal BUF_ENb through output terminals Q and /Q.

Based on the clock signal CLK, the level detection signal generator 120-3 may generate the level detection signal BUF_EN of the logic low level and the complementary level detection signal BUF_ENb of the logic high level when the output signal OUT is the logic low level, and generate the level detection signal BUF_EN of the logic high level and the complementary level detection signal BUF_ENb of the logic low level when the output signal OUT is the logic high level.

When a chip enable signal CE is inputted to a reset terminal RST of the D flip flop, the D flip flop may be reset.

Figure 4:
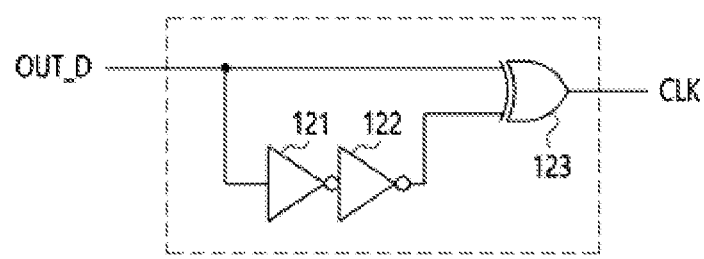
FIG. 4 is a diagram illustrating a configuration of a clock signal generation circuit according to an embodiment of the present disclosure.

FIG. 4 is a diagram illustrating a configuration of the clock signal generator 120-2 according to an embodiment of the present disclosure.

Referring to FIG. 4, the clock signal generator 120-2 may receive the delayed output signal OUT_D from the delay buffer 120-1 and generate the clock signal CLK.

The clock signal generator 120-2 may generate pulses at a rising edge and a falling edge of the output signal OUT, for example, the delayed output signal OUT_D, respectively, as the clock signal CLK.

The clock signal generator 120-2 may include a first inverting gate 121, a second inverting gate 122, and an exclusive OR (XOR) gate 123. The first and second inverting gates 121 and 122 may delay the first delayed output signal OUT_D output from the delay buffer 120-1 to generate a second delayed output signal. The XOR gate 123 may receive the first delayed output signal OUT_D output from the delay buffer 120-1 and the second delayed output signal output from the second inverting gate 122, perform a XOR logic operation on the first delayed output signal OUT_D and the second delayed output signal, and generate a XORed output as the clock signal CLK. Accordingly, the clock signal generator 120-2 may generate the pulses at the rising edge and the falling edge of the first delayed output signal OUT_D, respectively, as the clock signal. The clock signal CLK may be provided to the clock terminal of the D Flip flop in the level detection signal generator 120-3.

Figure 5:
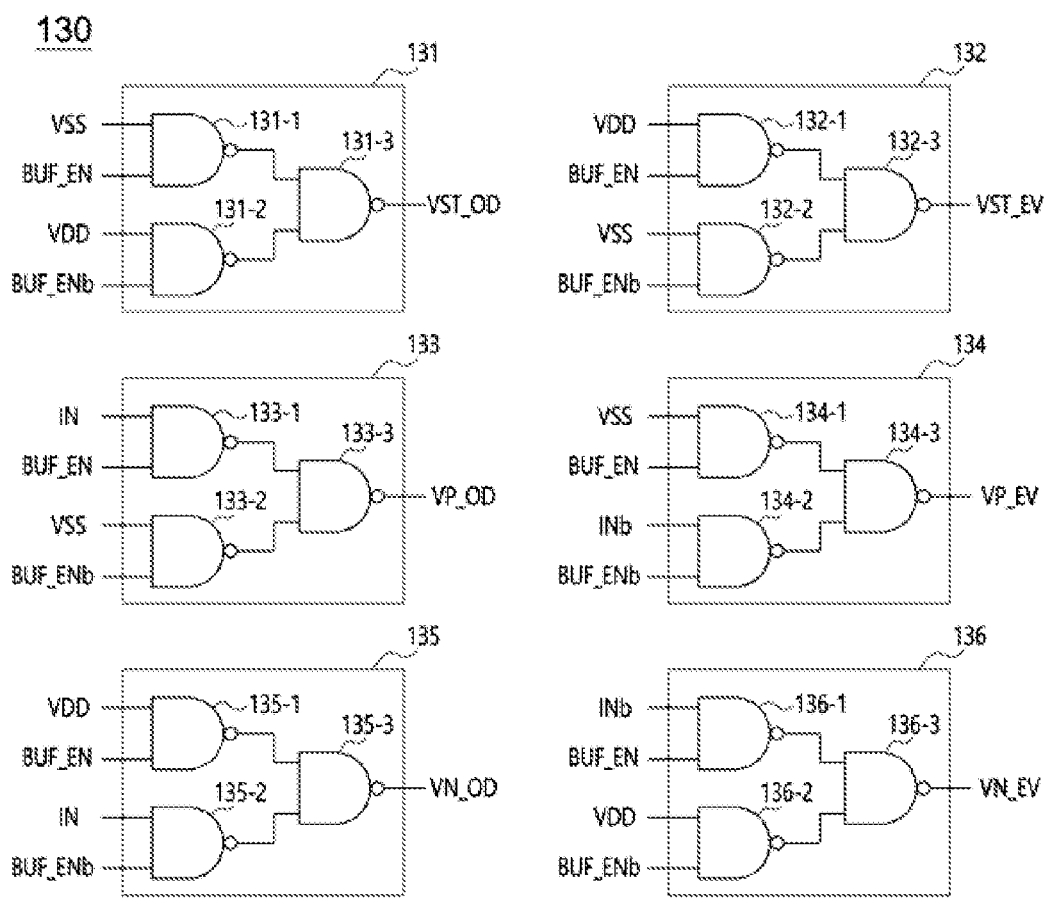
FIG. 5 is a diagram illustrating a configuration of a voltage signal generation circuit according to an embodiment of the present disclosure.

FIG. 5 is a diagram illustrating a configuration of the voltage signal generation circuit 130 according to an embodiment of the present disclosure.

Referring to FIG. 5, the voltage signal generation circuit 130 may receive the input signal IN, the complementary input signal INb, and the level detection signal BUF_EN and the complementary level detection signal BUF_ENb provided from the level detection circuit 120, generate the plurality of voltage signals, and provide the plurality of voltage signals to the glitch rejection circuit 110. The plurality of voltage signals may include the odd control voltage signal VST_OD, the even control voltage signal VST_EV, the first odd gate voltage signal VP_OD, the second odd gate voltage signal VN_OD, the first even gate voltage signal VP_EV, and the second even gate voltage signal VN_EV.

The voltage signal generation circuit 130 may generate the odd control voltage signal VST_OD and the even control voltage signal VST_EV, based on logic levels of the level detection signal BUF_EN and the complementary level detection signal BUF_ENb. Further, the voltage signal generation circuit 130 may generate the first odd gate voltage signal VP_OD and the second odd gate voltage signal VN_OD, based on logic levels of the input signal IN, the level detection signal BUF_EN, and the complementary level detection signal BUF_ENb. The voltage signal generation circuit 130 may generate the first even gate voltage signal VP_EV and the second even gate voltage signal VN_EV, based on logic levels of the complementary input signal INb, the level detection signal BUF_EN, and the complementary level detection signal BUF_ENb In an embodiment, when the glitch rejection circuit 110 is configured of a single two-stage inverter as illustrated in FIG. 2, the voltage signal generation circuit 130 may provide the odd control voltage signal VST_OD and the first and second odd gate voltage signals VP_OD and VN_OD, which have one level of the first power voltage VDD level and the second power voltage VSS level, to the first inverting circuit 111 which is the first stage inverter of the two-stage inverter, and the voltage signal generation circuit 130 may provide the even control voltage signal VST_EV and the first and second even gate voltage signals VP_EV and VN_EV, which have one level of the first power voltage VDD level and the second power voltage VSS level, to the second inverting circuit 112 which is the second stage inverter the two-stage inverter.

In another embodiment, when the glitch rejection circuit 110 is configured of multiple two-stage inverters, for example, 3 two-stage inverters unit1, unit2, and unit3 as illustrated in FIG. 6, the voltage signal generation circuit 130 may provide the odd control voltage signal VST_OD and the first and second odd gate voltage signals VP_OD and VN_OD, which have one level of the first power voltage VDD level and the second power voltage VSS level, to a first stage inverter 110-1 in each two-stage inverter unit1, unit2, and unit3. The voltage signal generation circuit 130 may provide the even control voltage signal VST_EV and the first and second even gate voltage signals VP_EV and VN_EV, which have one level of the first power voltage VDD level and the second power voltage VSS level, to a second stage inverter 110-2 in each two-stage inverter unit1, unit2, and unit3.

In further another embodiment, when the glitch rejection circuit 110 is configured of n m-stage inverter, the voltage signal generation circuit 130 may provide the odd control voltage signal VST_OD and the first and second odd gate voltage signals VP_OD and VN_OD, which have one level of the first power voltage VDD level and the second power voltage VSS level, to odd-numbered inverters of each m-stage inverter. The voltage signal generation circuit 130 may provide the even control voltage signal VST_EV and the first and second even gate voltage signals VP_EV and VN_EV, which have one level of the first power voltage VDD level and the second power voltage VSS level, to even-numbered inverters of each m-stage inverter.

The voltage signal generation circuit 130 may generate the plurality of voltage signals as the following Table 1.

TABLE 1

| IN/BUF_EN | 1(HIGH) | 0(LOW) |
|---|---|---|
| VST_OD | VSS | VDD |
| VST_EV | VDD | VSS |
| VP_OD | VDD | VSS |

TABLE 1-continued

| IN/BUF_EN | 1(HIGH) | 0(LOW) |
|---|---|---|
| VP_EV | VSS | VDD |
| VN_OD | VDD | VSS |
| VN_EV | VSS | VDD |

The voltage signal generation circuit 130 may include a plurality of voltage signal generators configured to receive the input signal IN and the complementary input signal INb, and the level detection signal BUF_EN and the complementary level detection signal BUF_ENb to generate the plurality of voltage signals. For example, the voltage signal generation circuit 130 may include a first voltage signal generator configured to generate a signal of the second power voltage VSS level or the first power voltage VDD level as the odd control voltage signal VST_OD according to the level detection signal BUF_EN and the complementary level detection signal BUF_ENb, and a second voltage signal generator configured to generate a signal of the first power voltage VDD level or the second power voltage VSS level as the even control voltage signal VST_EV according to the level detection signal BUF_EN and the complementary level detection signal BUF_ENb.

Further, the voltage signal generation circuit 130 may include a third voltage signal generator configured to generate a signal of the input signal IN level or the second power voltage VSS level as the first odd gate voltage signal VP_OD according to the level detection signal BUF_EN and the complementary level detection signal BUF_ENb, and a fourth voltage signal generator configured to generate a signal of the second power voltage VSS level or the complementary input signal INb level as the first even gate voltage signal VP_EV according to the level detection signal BUF_EN and the complementary level detection signal BUF_ENb. Further, the voltage signal generation circuit 130 may include a fifth voltage signal generator configured to generate a signal of the first power voltage VDD level or the input signal IN level as the second odd gate voltage signal VN_OD according to the level detection signal BUF_EN and the complementary level detection signal BUF_ENb, and a sixth voltage signal generator configured to generate a signal of the complementary input signal INb level or the first power voltage VDD level as the second even gate voltage signal VN_EV according to the level detection signal BUF_EN and the complementary level detection signal BUF_ENb.

The voltage signal generation circuit 130 may include first to sixth multiplexers 131 to 136 as the first to sixth voltage signal generators. Hereinafter, the first to sixth multiplexers 131 to 136 constituting the first to sixth voltage signal generators will be described in detail with reference to FIG. 5 with Table 1.

The first voltage signal generator may include the first multiplexer 131 configured to generate the odd control voltage signal VST_OD of the second power voltage VSS level or the first power voltage VDD level according to logic levels of the level detection signal BUF_EN and the complementary level detection signal BUF_ENb as selection signals. For example, the first multiplexer 131 may be configured to select and output the odd control voltage signal VST_OD of the second power voltage VSS level when the level detection signal BUF_EN has the logic high (1) level as the second logic level, and select and output the odd control voltage signal VST_OD of the first power voltage VDD level when the level detection signal BUF_EN has the logic low (0) level as the first logic level.

The second voltage signal generator may include the second multiplexer 132 configured to generate the even control voltage signal VST_EV of the first power voltage VDD level or the second power voltage VSS level according to the logic levels of the level detection signal BUF_EN and the complementary level detection signal BUF_ENb VST_EV as the selection signals. For example, the second multiplexer 132 may be configured to select and output the even control voltage signal VST_EV of the first power voltage VDD level when the level detection signal BUF_EN has the logic high (1) level, and select and output the even control voltage signal VST_EV of the second power voltage VSS level when the level detection signal BUF_EN has the logic low (0) level.

The third voltage signal generator may include the third multiplexer 133 configured to generate the first odd gate voltage signal VP_OD of the input signal IN level or the second power voltage VSS level according to the logic levels of the level detection signal BUF_EN and the complementary level detection signal BUF_ENb as the selection signals. For example, the third multiplexer 133 may be configured to select and output the first odd gate voltage signal VP_OD of the input signal IN level (for example, the first power voltage VDD level) when the level detection signal BUF_EN has the logic high (1) level, and select and output the first odd gate voltage signal VP_OD of the second power voltage VSS level when the level detection signal BUF_EN has the logic low (0) level.

The fourth voltage signal generator may include the fourth multiplexer 134 configured to generate the first even gate voltage signal VP_EV of the second power voltage VSS level or the complementary input signal INb level according to the logic levels of the level detection signal BUF_EN and the complementary level detection signal BUF_ENb as the selection signals. For example, the fourth multiplexer 134 may be configured to select and output the first even gate voltage signal VP_EV of the second power voltage VSS level when the level detection signal BUF_EN has the logic high (1) level, and select and output the first even gate voltage signal VP_EV of the complementary input signal INb level (for example, the first power voltage VDD level) when the level detection signal BUF_EN has the logic low (0) level.

The fifth voltage signal generator may include the fifth multiplexer 135 configured to generate the second odd gate voltage signal VN_OD of the first power voltage VDD level or the input signal IN level according to the logic levels of the level detection signal BUF_EN and the complementary level detection signal BUF_ENb as the selection signals. For example, the fifth multiplexer 135 may be configured to select and output the second odd gate voltage signal VN_OD of the first power voltage VDD level when the level detection signal BUF_EN has the logic high (1) level, and select and output the second odd gate voltage signal VN_OD of the input signal IN level (for example, the second power voltage VSS level) when the level detection signal BUF_EN has the logic low (0) level.

The sixth voltage signal generator may include the sixth multiplexer 136 configured to generate the second even gate voltage signal VP_EV of the complementary input signal INb level or the first power voltage VDD level according to the logic levels of the level detection signal BUF_EN and the complementary level detection signal BUF_ENb as the selection signals. For example, the sixth multiplexer 136 may be configured to select and output the second even gate voltage signal VN_EV of the complementary input signal INb level (for example, the second power voltage VSS level) when the level detection signal BUF_EN has the logic high (1) level, and select and output the second even gate voltage signal VN_EV of the first power voltage VDD level when the level detection signal BUF_EN has the logic low (0) level.

Each of the first to sixth multiplexers 131 to 136 in the voltage signal generation circuit 130 may include a plurality of logic gates, for example, the first multiplexer 131 includes first to third NAND gates 131-1, 131-1, and 131-3; the second multiplexer 132 includes first to third NAND gates 132-1, 132-2, and 132-3; . . . ; and the six multiplexer 136 includes first to third NAND gates 136-1, 136-2, and 136-3.

In the first multiplexer 131, the first NAND gate 131-1 may receive the second power voltage VSS level signal and the level detection signal BUF_EN. The second NAND gate 131-2 may receive the first power voltage VDD level signal and the complementary level detection signal BUF_ENb. The third NAND gate 131-3 may receive output signals of the first and second NAND gates 131-1 and 131-2 and generate the odd control voltage signal VST_OD. For example, the first multiplexor 131 may output the second power voltage VSS level signal as the odd control voltage signal VST_OD when the level detection signal BUF_EN is the logic high level, and output the first power voltage VDD level signal as the odd control voltage signal VST_OD when the level detection signal BUF_EN is the logic low level.

In the second multiplexer 132, the first NAND gate 132-1 may receive the first power voltage VDD level signal and the level detection signal BUF_EN. The second NAND gate 132-2 may receive the second power voltage VSS level signal and the complementary level detection signal BUF_ENb. The third NAND gate 132-3 may receive output signals of the first and second NAND gates 132-1 and 132-2 and generate the even control voltage signal VST_EV. For example, the second multiplexor 132 may output the first power voltage VDD level signal as the even control voltage signal VST_EV when the level detection signal BUF_EN is the logic high level, and output the second power voltage VSS level signal as the even control voltage signal VST_EV when the level detection signal BUF_EN is the logic low level.

In the third multiplexer 133, the first NAND gate 133-1 may receive the input signal IN and the level detection signal BUF_EN. The second NAND gate 133-2 may receive the second power voltage VSS level signal and the complementary level detection signal BUF_ENb. The third NAND gate 133-3 may receive output signals of the first and second NAND gates 133-1 and 133-2 and generate the first odd gate voltage signal VP_OD. For example, the third multiplexor 133 may output the signal of the input signal IN level (for example, the first power voltage VDD level signal) as the first odd gate voltage signal VP_OD when the level detection signal BUF_EN is the logic high level, and output the second power voltage VSS level signal as the first odd gate voltage signal VP_OD when the level detection signal BUF_EN is the logic low level.

In the fourth multiplexer 134, the first NAND gate 134-1 may receive the second power voltage VSS level signal and the level detection signal BUF_EN. The second NAND gate 134-2 may receive the complementary input signal INb and the complementary level detection signal BUF_ENb. The third NAND gate 134-3 may receive output signals of the first and second NAND gates 134-1 and 134-2 and generate the first even gate voltage signal VP_EV. For example, the fourth multiplexor 134 may output the second power voltage VSS level signal as the first even gate voltage signal VP_EV when the level detection signal BUF_EN is the logic high level, and output the signal of the complementary input signal INb level (for example, the first power voltage VDD level signal) as the first even gate voltage signal VP_EV when the level detection signal BUF_EN is the logic low level.

In the fifth multiplexer 135, the first NAND gate 135-1 may receive the first power voltage VDD level signal and the level detection signal BUF_EN. The second NAND gate 135-2 may receive the input signal IN and the complementary level detection signal BUF_ENb. The third NAND gate 135-3 may receive output signals of the first and second NAND gates 135-1 and 135-2 and generate the second odd gate voltage signal VN_OD. For example, the fifth multiplexer 135 may output the first power voltage VDD level signal as the second odd gate voltage signal VN_OD when the level detection signal BUF_EN is the logic high level, and output the signal of the input signal IN level (for example, the second power voltage VSS level signal) as the second odd gate voltage signal VN_OD when the level detection signal BUF_EN is the logic low level.

In the sixth multiplexer 136, the first NAND gate 136-1 may receive the complementary input signal INb and the level detection signal BUF_EN. The second NAND gate 136-2 may receive the first power voltage VDD level signal and the complementary level detection signal BUF_ENb. The third NAND gate 136-3 may receive output signals of the first and second NAND gates 136-1 and 136-2 and generate the second even gate voltage signal VN_EV. For example, the sixth multiplexor 136 may output the signal of the complementary input signal INb level (for example, the second power voltage VSS level signal) as the second even gate voltage signal VN_EV when the level detection signal BUF_EN is the logic high level, and output the first power voltage VDD level signal as the second even gate voltage signal VN_EV when the level detection signal BUF_EN is the logic low level.

FIG. 6 is a diagram explaining a process of reducing a glitch and/or noise through the signal generation apparatus 100 according to an embodiment of the present disclosure. It has been illustrated in FIG. 6 that the glitch rejection circuit 110 is configured of 3 inverter chains, for example, 3 two-stage inverters unit1, unit2, and unit3 sequentially coupled in series, but this is not limited thereto. In the glitch rejection circuit 110, a maximum value of the glitch and/or noise which can be rejected per unit, for example, per two-stage inverter may be determined, and thus when the glitch rejection circuit 110 is configured of n inverter chains (n units) coupled in series, the glitch and/or noise may be removed by n times maximum value per unit.

An operation of the signal generation apparatus 100 according to an embodiment of the present disclosure will be described with reference to FIG. 6.

The glitch rejection circuit 110 of the signal generation apparatus 100 may be configured of multiple two-stage inverters, for example, n two-stage Schmitt trigger inverters (where, n is a natural number) coupled in series.

FIG. 6 illustrates that a glitch and/or noise occurs in the input signal IN which has to be maintained in the logic high level or in the logic low level. Case 1 is a process of rejecting a high-low-high glitch and/or noise occurring in the input signal IN of the logic high level, and Case 2 is a process of rejecting a low-high-low glitch and/or noise occurring in the input signal IN of the logic low level.

For example, when the glitch of the low logic level occurs in the input signal IN of the logic high level, the odd control voltage signal VST_OD of the second power voltage VSS level may be applied to the odd-numbered inverter 110-1 of each two-stage inverter unit1, unit2, and unit3 in FIG. 6, which corresponds to the first inverting circuit 111 of FIG. 2, to increase switching threshold voltages of PMOS transistors constituting the odd-numbered inverter 110-1. The even control voltage signal VST_EV of the first power voltage VDD level may be applied to the even-numbered inverter 110-2 of FIG. 6, which corresponds to the second inverting circuit 112 of FIG. 2, to increase switching threshold voltages of NMOS transistors constituting the even-numbered inverter 110-2. Through such a repetitive operation, the high-low-high glitch and/or noise may be increasingly reduced via the inverter chains unit1, unit2, and unit 3 as illustrated in FIG. 6 (Case 1).

Further, when the glitch of the high logic level occurs in the input signal IN of the logic low level, the odd control voltage signal VST_OD of the first power voltage VDD level may be applied to the odd-numbered inverter 110-1 of FIG. 6, which corresponds to the first inverting circuit 111 of FIG. 2, to increase switching threshold voltages of NMOS transistors constituting the odd-numbered inverter 110-1. The even control voltage signal VST_EV of the second power voltage VSS level may be applied to the even-numbered inverter 110-2 of FIG. 6, which corresponds to the second inverting circuit 112 of FIG. 2, to increase switching threshold voltages of PMOS transistors constituting the even-numbered inverter 110-2. Through such a repetitive operation, the low-high-low glitch and/or noise may be increasingly reduced via the inverter chains unit1, unit2, and unit 3 as illustrated in FIG. 6 (Case 2).

Figure 7:
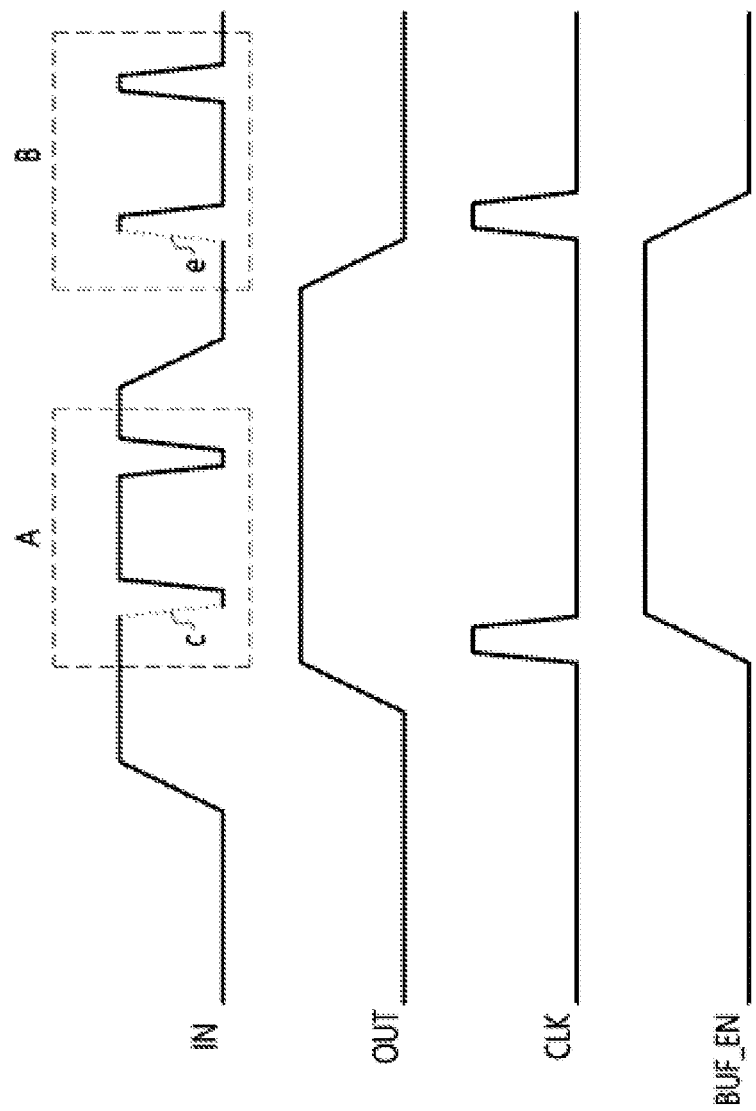
FIG. 7 is a timing diagram explaining an operation of a signal generation apparatus according to an embodiment of the present disclosure.

FIG. 7 is a timing diagram explaining an operation of the signal generation apparatus 100 according to an embodiment of the present disclosure.

Referring to FIG. 7, when the glitch and/or noise occurs in the input signal IN, the signal generation apparatus 100 may detect level transition of the output signal OUT. When the high-low-high glitch occurs in the input signal IN as indicated by "A", the switching threshold voltage of a turn-on path of the PMOS transistors may be increased in advance in level transition of the glitch of the input signal IN from the high-low logic level to the low-high logic level and thus the high-low logic level transition time of the glitch of the input signal IN may be Increased. Then, the switching threshold voltage of a turn-on path of the NMOS transistors may be increased in level transition of the glitch of the input signal IN from the low-high logic level to the high-low logic level, and thus the high-low logic level transition time of the glitch in the input signal may be additionally increased. Accordingly, only the level transition time of the high-low level portion as indicated by "c" In the high-low-high logic level glitch (A) may be increased, and thus the pulse time width of the glitch of the input signal IN in the logic high-low-high level transition may be reduced.

When the low-high-low glitch occurs in the input signal IN as indicated by "B", the switching threshold voltage of the turn-on path of the NMOS transistors may be increased in advance in level transition of the glitch of the input signal IN from the low-high logic level to the high-low logic level, and thus the low-high logic level transition time of the glitch of the input signal IN may be increased. Then, the switching threshold voltage of the turn-on path of the PMOS transistors may be increased in level transition of the glitch of the input signal IN from the high-low logic level to the logic low-high level, and thus the low-high logic level transition time of the glitch of the input signal IN may be additionally increased. Accordingly, only the level transition time in the low-high logic level portion as indicated by "e" in the low-high-low logic level glitch (B) may be increased, and thus the pulse time width of the glitch of the input signal IN in the logic low-high-low level transition may be reduced The pulses as the clock signal CLK may be generated at a rising edge and a falling edge of the output signal OUT and the level detection signal BUF_EN and the complementary level detection signal BUF_ENb may be generated based on the clock signal CLK.

The level detection signal BUF_EN may be a signal which determines whether the high-low-high glitch or the low-high-low glitch occurs in the input signal IN in the voltage signal generation circuit 130.

The above described embodiments of the present disclosure are intended to illustrate and not to limit the present disclosure. Various alternatives and equivalents are possible. The embodiments are not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A signal generation apparatus comprising:
a glitch rejection circuit including n m-stage inverters coupled in series, and configured to receive an input signal and perform an inverting operation on the input signal to generate an output signal and adjust switching threshold voltages of the n m-stage inverters to generate the glitch-removed output signal, when a glitch occurs in the input signal;
a level detection circuit configured to detect a logic level of the output signal provided from the glitch rejection circuit to generate a level detection signal and a complementary level detection signal; and
a voltage signal generation circuit configured to receive the level detection signal, and the complementary level detection signal to generate control voltage signals and provide the control voltage signals to the glitch rejection circuit,
wherein n is a natural number and m is an even number greater than or equal to 2, and
wherein each inverter of the n m-stage inverters adjusts its switching threshold voltage in response to a corresponding control voltage signal of the control voltage signals, the corresponding control voltage signal switching between a first power voltage level and a second power voltage level based on the level detection signal and the complementary level detection signal.

2. The signal generation apparatus of claim 1, wherein the control voltage signals includes an odd control voltage signal provided to each of odd-numbered inverting circuits in each of the n m-stage inverters and an even control voltage signal provided to each of even-numbered inverting circuits in each of the n m-stage inverters, and
wherein the voltage signal generation circuit further generates first and second odd gate voltage signals provided to each odd-numbered inverting circuit in each m-stage inverter and the first and second even gate voltage signals provided to each even-numbered inverting circuit in each m-stage inverter, based on the input signal, a complementary input signal, the level detection signal, and the complementary level detection signal.

3. The signal generation apparatus of claim 2, wherein each m-stage inverter of the glitch rejection circuit includes:
the odd-numbered inverting circuit which performs the inverting operation on the input signal to generate the complementary input signal based on the first and second odd gate voltage signals, and the switching threshold voltage thereof is adjusted based on the odd control voltage signal; and
the even-numbered inverting circuit which performs the inverting operation on the complementary input signal to generate the output signal based on the first and second even gate voltage signals, and the switching threshold voltage thereof is adjusted based on the even control voltage signal.

4. The signal generation apparatus of claim 3, wherein the odd-numbered inverting circuit includes:
an odd-numbered inverter configured to invert the input signal to generate the complementary input signal based on the first and second odd gate voltage signals; and
an odd-numbered adjuster configured to adjust the switching threshold voltage of the odd-numbered inverter based on the odd control voltage signal, and
wherein the even-numbered inverting circuit includes:
an even-numbered inverter configured to invert the complementary input signal to generate the output signal based on the first and second the even gate voltage signals; and
an even-numbered adjuster configured to adjust the switching threshold voltage of the even-numbered inverter based on the even control voltage signal.

5. The signal generation apparatus of claim 4, wherein the odd-numbered inverter includes:
a first inverter configured to invert the input signal to generate the complementary input signal, based on the first odd gate voltage signal, in a first operation mode; and
a second inverter configured to invert the input signal to generate the complementary input signal, based on the second odd gate voltage signal, in a second operation mode, and
wherein the odd-numbered adjuster includes:
a first adjuster configured to adjust, based on the odd control voltage signal, the switching threshold voltage of the first inverter when a glitch transited from a first logic level to a second logic level occurs in the input signal in the first operation mode; and
a second adjuster configured to adjust, based on the odd control voltage signal, the switching threshold voltage of the second inverter when a glitch transited from the second logic level to the first logic level occurs in the input signal in the second operation mode.

6. The signal generation apparatus of claim 5, wherein the first inverter of the odd-numbered inverter includes first and second PMOS transistors which are coupled in series between a first power voltage terminal and a complementary input signal terminal, and the first odd gate voltage signal and the input signal are applied to gates thereof, respectively, and
the first adjuster of the odd-numbered adjuster includes a third PMOS transistor which is coupled between a connection node of the first and second PMOS transistors and a first node for application of the odd control voltage signal and a gate thereof is coupled to the complementary input signal terminal.

7. The signal generation apparatus of claim 6, wherein the second inverter of the odd-numbered inverter includes first and second NMOS transistors which are coupled in series between a second power voltage terminal and the complementary input signal terminal, and the second odd gate voltage signal and the input signal are applied to gates thereof, respectively, and the second adjuster of the odd-numbered adjuster includes a third NMOS transistor which is coupled between a connection node of the first and second NMOS transistors and the first node for application of the odd control voltage signal and a gate thereof is coupled to the complementary input signal terminal.

8. The signal generation apparatus of claim 4, wherein the even-numbered inverter includes:

a first inverter configured to invert the complementary input signal to generate the output signal, based on the first even gate voltage signal, in a second operation mode; and a second inverter configured to invert the complementary input signal to generate the output signal, based on the second even gate voltage signal, in a first operation mode, and wherein the even-numbered adjuster includes:

a first adjuster configured to adjust, based on the even control voltage signal, the switching threshold voltage of the first inverter when a glitch transited from a first logic level to a second logic level occurs in the complementary input signal in the second operation mode; and a second adjuster configured to adjust, based on the even control voltage signal, the switching threshold voltage of the second inverter when a glitch transited from the second logic level to the first logic level occurs in the complementary input signal in the first operation mode.

9. The signal generation apparatus of claim 8, wherein the first inverter of the even-numbered inverter includes first and second PMOS transistors which are coupled in series between a first power voltage terminal and an output signal terminal, and the first even gate voltage signal and the complementary input signal are applied to gates thereof, respectively, and the first adjuster of the even-numbered adjuster includes a third PMOS transistor which is coupled between a connection node of the first and second PMOS transistors and a second node for application of the even control voltage signal and a gate thereof is coupled to the output signal terminal.

10. The signal generation apparatus of claim 9, wherein the second inverter of the even-numbered inverter includes first and second NMOS transistors which are coupled in series between a second power voltage terminal and the output signal terminal, and the second even gate voltage signal and the complementary input signal are applied to gates thereof, respectively, and the second adjuster of the even-numbered adjuster includes a third NMOS transistor which is coupled between a connection node of the first and second NMOS transistors and the second node for application of the even control voltage signal and a gate thereof is coupled to the output signal terminal.

11. The signal generation apparatus of claim 1, wherein the level detection circuit performs an exclusive-OR operation on a first delayed signal of the output signal and a second delayed signal of the output signal to generate clock pulses at a rising edge and a falling edge of the output signal, detects the logic level of the output signal to generate the level detection signal and the complementary level detection signal based on the clock pulses, and provides the level detection signal and the complementary level detection signal to the voltage signal generation circuit.

12. The signal generation apparatus of claim 2, wherein the voltage signal generation circuit includes:

a control voltage signal generator configured to generate the odd and even control voltage signals of the first power voltage level or the second power voltage level based on the level detection signal and the complementary level detection signal and provide the odd and even control voltage signals to the glitch rejection circuit;

a first gate voltage signal generator configured to generate the first odd and even gate voltage signals of one level of an input signal level and a complementary input signal level or the second power voltage level based on the level detection signal and the complementary level detection signal and provide the first odd and even gate voltage signals to the glitch rejection circuit; and a second gate voltage signal generator configured to generate the second odd and even gate voltage signals of one level of the input signal level and the complementary input signal level or the first power voltage level based on the level detection signal and the complementary level detection signal and provide the second odd and even gate voltage signals to the glitch rejection circuit.

13. The signal generation apparatus of claim 12, wherein the control voltage signal generator includes:

a first multiplexer configured to select and output a signal of the second power voltage level or the first power voltage level as the odd control voltage signal based on the level detection signal and the complementary level detection signal; and a second multiplexer configured to select and output a signal of the first power voltage level or the second power voltage level as the even control voltage signal based on the level detection signal and the complementary level detection signal.

14. The signal generation apparatus of claim 13, wherein in a first operation mode that a glitch transited from a first logic level to a second logic level occurs in the input signal of the first logic level, the first and second multiplexers select the odd control voltage signal of the first power voltage level and the even control voltage signal of the second power voltage level based on the complementary level detection signal, and output the selected odd and even control voltage signals to the odd-numbered inverting circuit and the even-numbered inverting circuit of each m-stage inverter, and in a second operation mode that a glitch transited from the second logic level to the first logic level occurs in the input signal of the second logic level, the first and second multiplexers select the odd control voltage signal of the second power voltage level and the even control voltage signal of the first power voltage level based on the level detection signal, and output the selected odd and even control voltage signals to the odd-numbered inverting circuit and the even-numbered inverting circuit of each m-stage inverter.

15. The signal generation apparatus of claim 14, wherein the first gate voltage signal generator includes:

a third multiplexer configured to select and output a signal of the input signal level or the second power voltage level as the first odd gate voltage signal based on the level detection signal and the complementary level detection signal; and a fourth multiplexer configured to select and output a signal of the second power voltage level or the complementary input signal level as the first even gate voltage signal based on the level detection signal and the complementary level detection signal.

16. The signal generation apparatus of claim 15, wherein in the first operation mode that the glitch transited from the first logic level to the second logic level occurs in the input signal of the first logic level, the third and fourth multiplexers select the first odd gate voltage signal of the second power voltage level and the first even gate voltage signal of the complementary input signal level as the first power voltage level based on the complementary level detection signal, and output the selected first odd and even gate voltage signals to the odd-numbered inverting circuit and the even-numbered inverting circuit of each m-stage inverter, and in the second operation mode that the glitch transited from the second logic level to the first logic level occurs in the input signal of the second logic level, the third and fourth multiplexers select the first odd gate voltage signal of the input signal level as the first power voltage level and the first even gate voltage signal of the second power voltage level based on the level detection signal, and output the selected first odd and even gate voltage signals to the odd-numbered inverting circuit and the even-numbered inverting circuit of each m-stage inverter.

17. The signal generation apparatus of claim 16, wherein the second gate voltage signal generator includes:
a fifth multiplexer configured to select and output the signal of the first power voltage level or the input signal level as the second odd gate voltage signal based on the level detection signal and the complementary level detection signal; and
a sixth multiplexer configured to select and output the signal of the complementary input signal level or the first power voltage level as the second even gate voltage signal based on the level detection signal and the complementary level detection signal.

18. The signal generation apparatus of claim 17, wherein in the first operation mode that the glitch transited from the first logic level to the second logic level occurs in the input signal of the first logic level, the fifth and sixth multiplexers select the second odd gate voltage signal of the input signal level as the second power voltage level and the second even gate voltage signal of the first power voltage level based on the complementary level detection signal, and output the selected second odd and even gate voltage signals to the odd-numbered inverting circuit and the even-numbered inverting circuit of each m-stage inverter, and in the second operation mode that the glitch transited from the second logic level to the first logic level occurs in the input signal of the second logic level, the fifth and sixth multiplexers select the second odd gate voltage signal of the first power voltage level and the second even gate voltage signal of the complementary input signal level as the second power voltage level based on the level detection signal, and output the selected second odd and even gate voltage signals to the odd-numbered inverting circuit and the even-numbered inverting circuit of each m-stage inverter.

19. A signal generation apparatus comprising:
a first inverting circuit configured to invert an input signal to generate a complementary input signal based on first and second gate voltage signals, wherein a switching threshold voltage of the first inverting circuit is adjusted based on a first control voltage signal when a glitch occurs in the input signal, the first control voltage signal switching between a first power voltage level and a second power voltage level;
a second inverting circuit configured to invert the complementary input signal received from the first inverting circuit to generate an output signal based on third and fourth gate voltage signals, wherein a switching threshold voltage of the second inverting circuit is adjusted based on a second control voltage signal when a glitch occurs in the complementary input signal, the second control voltage signal switching between the first power voltage level and the second power voltage level;
a level detection circuit configured to generate clock pulses at a rising edge and a falling edge of the output signal received from the second inverting circuit, and detect a logic level of the output signal to generate a level detection signal and a complementary level detection signal based on the clock pulses; and
a voltage signal generation circuit configured to, based on the level detection signal and the complementary level detection signal received from the level detection circuit, generate the first and second control voltage signals, the first and second gate voltage signals, and the third and fourth gate voltage signals having the first power voltage level or the second power voltage level and provide the generated voltage signals to the first and second inverting circuits.

20. The signal generation apparatus of claim 19, wherein the voltage signal generation circuit selects the first control voltage signal of the first power voltage level and the first and second gate voltage signals of the second power voltage level based on the complementary level detection signal and provides the selected voltage signals to the first inverting circuit, and selects the second control voltage signal of the second power voltage level and the third and fourth gate voltage signals of the first power voltage level based on the complementary level detection signal and provides the selected voltage signals to the second inverting circuit in a first operation mode that a glitch transited from a first logic level to a second logic level occurs in the input signal of the first logic level, and the voltage signal generation circuit selects the first control voltage signal of the second power voltage level and the first and second gate voltage signals of the first power voltage level based on the level detection signal and provides the selected voltage signals to the first inverting circuit, and selects the second control voltage signal of the first power voltage level and the third and fourth gate voltage signals of the second power voltage level based on the level detection signal and provides the selected voltage signals to the second inverting circuit in a second operation mode that a glitch transited from the second logic level to the first logic level occurs in the input signal of the second logic level.

21. The signal generation apparatus of claim 20, wherein the first inverting circuit includes:
a first inverter configured to invert the input signal to generate the complementary input signal through a first output terminal based on the first and second gate voltage signals; and
a first adjuster configured to adjust a switching threshold voltage of the first inverter based on the first control voltage signal, and wherein the second inverting circuit includes:
a second inverter configured to invert the complementary input signal received from the first output terminal of the first inverter to generate the output signal through a second output terminal based on the third and fourth gate voltage signals; and a second adjuster configured to adjust a switching threshold voltage of the second inverter based on the second control voltage signal.

* * * * *